(12) United States Patent
Weber et al.

(10) Patent No.: US 8,759,202 B2
(45) Date of Patent: Jun. 24, 2014

(54) SEMICONDUCTOR DEVICE AND MANUFACTURING METHOD

(71) Applicant: Infineon Technologies Austria AG, Villach (AT)

(72) Inventors: Hans Weber, Bayerisch Gmain (DE); Gerald Deboy, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/802,929

(22) Filed: Mar. 14, 2013

(65) Prior Publication Data

US 2013/0214395 A1 Aug. 22, 2013

Related U.S. Application Data

(62) Division of application No. 12/626,425, filed on Nov. 25, 2009, now Pat. No. 8,421,196.

(51) Int. Cl.
*H01L 29/06* (2006.01)
*H01L 21/20* (2006.01)

(52) U.S. Cl.
USPC ........... 438/478; 438/268; 438/270; 438/271; 438/561; 257/330; 257/655; 257/E21.09; 257/E21.418

(58) Field of Classification Search
CPC ............... H01L 29/0607; H01L 21/20; H01L 29/66712; H01L 29/1095; H01L 29/7813; H01L 21/2018; H01L 29/42368; H01L 29/66734; H01L 29/66621; H01L 21/02381; H01L 21/02532
USPC ................. 438/478, 268, 270, 561, 259, 271; 257/655, 355, 330, 331, E21.418, 257/E21.09
See application file for complete search history.

(56) References Cited

U.S. PATENT DOCUMENTS

| 4,754,310 | A | 6/1988 | Coe |
| 5,216,275 | A | 6/1993 | Chen |

(Continued)

FOREIGN PATENT DOCUMENTS

| DE | 19840032 C1 | 11/1999 |
| DE | 10132136 C1 | 2/2003 |
| DE | 10234996 A1 | 10/2003 |
| WO | 2005065385 A2 | 7/2005 |

OTHER PUBLICATIONS

Office Action mailed Apr. 5, 2012 in U.S. Appl. No. 12/626,425.

*Primary Examiner* — Thinh T Nguyen
(74) *Attorney, Agent, or Firm* — Dicke, Billig & Czaja, PLLC (57) ABSTRACT

A semiconductor device includes a drift zone of a first conductivity type formed within a semiconductor body, wherein one side of opposing sides of the drift zone adjoins a first zone within the semiconductor body and the other side adjoins a second zone within the semiconductor body. First semiconductor subzones of a second conductivity type different from the first conductivity type are formed within each of the first and second zones opposing each other along a lateral direction extending parallel to a surface of the semiconductor body. A second semiconductor subzone is formed within each of the first and second zones and between the first semiconductor subzones along the lateral direction. An average concentration of dopants within the second semiconductor subzone along 10% to 90% of an extension of the second semiconductor subzone along a vertical direction perpendicular to the surface is smaller than the average concentration of dopants along a corresponding section of extension within the drift zone.

3 Claims, 10 Drawing Sheets

(56) References Cited

U.S. PATENT DOCUMENTS

| | | |
|---|---|---|
| 6,291,856 B1 | 9/2001 | Miyasaka et al. |
| 6,551,909 B1 | 4/2003 | Fujihira |
| 6,586,801 B2 * | 7/2003 | Onishi et al. ............ 257/339 |
| 6,630,698 B1 | 10/2003 | Deboy et al. |
| 6,677,626 B1 | 1/2004 | Shindou et al. |
| 6,821,824 B2 | 11/2004 | Minato et al. |
| 6,960,798 B2 | 11/2005 | Deboy et al. |
| 6,982,459 B2 * | 1/2006 | Suzuki et al. ............ 257/329 |
| 7,301,203 B2 | 11/2007 | Lee et al. |
| 7,939,850 B2 | 5/2011 | Mauder et al. |
| 2005/0116313 A1 | 6/2005 | Lee et al. |
| 2006/0208334 A1 | 9/2006 | Yamauchi et al. |
| 2007/0272977 A1 | 11/2007 | Saito et al. |

\* cited by examiner

SEMICONDUCTOR DEVICE AND MANUFACTURING METHOD

CROSS-REFERENCE TO RELATED APPLICATION

This Utility Patent Application is a divisional of U.S. patent application Ser. No. 12/626,425, filed Nov. 25, 2009, which is incorporated herein by reference.

BACKGROUND

Semiconductor compensation devices such as n- or p-channel Metal Oxide Semiconductor Field Effect Transistors (n- or p-channel MOSFETs), diodes, Silicon-Controlled Rectifiers (SCRs), Gate Turn-Off thyristors (GTO thyristors) are frequently used for applications requiring low on-resistance $R_{DS(on)}$. These devices are based on mutual compensation of the charge of n- and p-doped regions in a semiconductor body of the device. The n- and p-doped regions are spatially arranged such that, in a reverse operation mode, a space charge of the n-doped region compensates the space charge of the p-doped region. By using this compensation of the p- and n-doping, a concentration of dopants of the one of these regions constituting a drift zone can be increased, whereby, despite a possible loss in the current-carrying area, a gain in $R_{DS(on)}$ is achieved. Production tolerances such as lithographic mismatch or deviations of target dopant concentrations may lead to deviations of desired compensation of these n- and p-doped regions. This may have a negative impact on device performance such as decreased device breakdown voltage.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts. The features of the various illustrated embodiments can be combined in any way unless they exclude each other.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
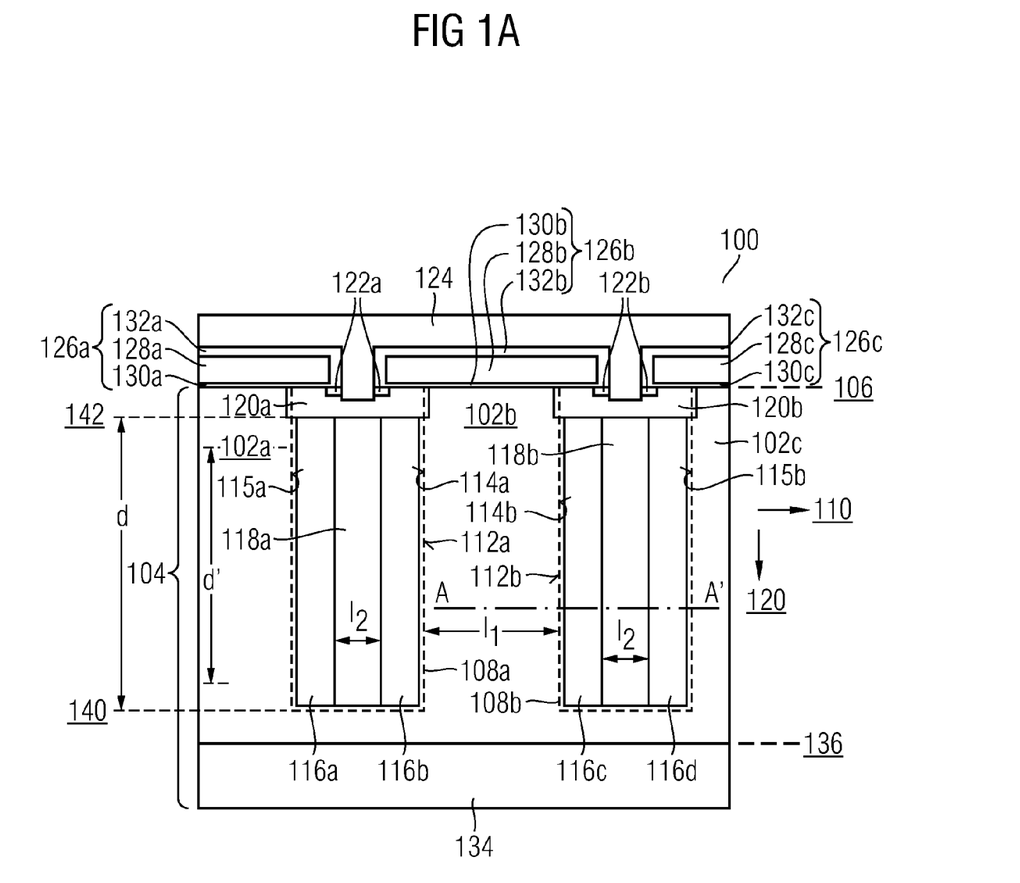
FIG. 1A illustrates one embodiment of a semiconductor compensation device including a cross-sectional view of a portion of a lateral channel FET including first and second semiconductor subzones.

FIG. 1A illustrates one embodiment of a lateral channel semiconductor compensation device 100 including drift zones 102a . . . 102c of a first conductivity type within a semiconductor body 104. From a front surface 106 of the semiconductor body 104, zones 108a, 108b extend into a depth of the semiconductor body 104 along a vertical direction. The drift zones 102a . . . 102c and the zones 108a, 108b are sequentially arranged along a lateral direction 110 extending in parallel to the front surface 106 of the semiconductor body 104.

In the compensation device 100 illustrated in FIG. 1, the sequence of arrangement of these elements along the lateral direction 110 is drift zone 102a, zone 108a, drift zone 102b, zone 108b, drift zone 102c. One side 112a of opposing sides 112a, 112b of the drift zone 102b adjoins a side 114a of zone 108a and the other side 112b of the opposing sides 112a, 112b of the drift zone 102b adjoins a side 114b of the zone 108b within the semiconductor body 104. First semiconductor subzones 116a . . . 116d of a second conductivity type different from the first conductivity type are arranged at opposing sides 114a, 115a and 114b, 115b within the zones 108a, 108b, respectively. The first semiconductor subzones 116a, 116b adjoin the drift zones 102a, 102b and the first semiconductor subzones 116c, 116d adjoin the drift zones 102b, 102c, respectively.

Second semiconductor subzones 118a, 118b are arranged within the zones 108a, 108b. The second semiconductor subzone 118a adjoins the first semiconductor subzones 116a, 116b, and the second semiconductor subzone 118b adjoins the first semiconductor subzones 116c, 116d, respectively. In one embodiment, each of the first and second semiconductor subzones 116a . . . 116d, 118a, 118b has a columnar shape, i.e., a dimension of each of the subzones being larger in the vertical direction 120 than in the lateral direction 110. A bottom side 140 of each of the first semiconductor subzones 116a . . . 116d and each of the second semiconductor subzones 118a, 118b adjoins a portion of the semiconductor body 104 having the first conductivity type.

Semiconductor device 100 furthermore includes body regions 120a, 120b of the second conductivity type. The body regions 120a, 120b are arranged at a top side 142 of the first and second semiconductor subzones 116a . . . 116d, 118a, 118b. Source regions 122a, 122b of the first conductivity type are arranged at the front surface 106 within the semiconductor body 104. The source regions 122a, 122b and the body regions 120a, 120b are electrically coupled to a conductive structure 124. Gate structures 126a . . . 126c including gate electrodes 128a . . . 128c, gate dielectrics 130a . . . 130c and insulation structures 132a . . . 132c are arranged on the front surface 106 of the semiconductor body 104. The gate structures 126a . . . 126c are configured to control the conductivity of lateral channel regions formed within that portion of body regions 120a, 120b that is located between the source regions 122a, 122b and the drift zones 102a . . . 102c at the front surface 106. A drain region 134 of the first conductivity type is arranged at a back surface 136 of semiconductor body 104 opposite to the front surface 106.

The top side 142 of each of the first semiconductor subzones 116a . . . 116d and each of the second semiconductor subzones 118a, 118b adjoins a bottom side of the body regions 120a, 120b. An average concentration of dopants within the second semiconductor subzones 118a, 118b along 10% to 90% of an extension d of the second semiconductor subzones 118a, 118b along the vertical direction 120 is smaller than the average concentration of dopants along a corresponding section of extension within the drift zones 102a . . . 102c. This section of extension along 10% to 90% of d is schematically illustrated as d'.

In the semiconductor compensation device 100, charge compensation of the drift zones 102a . . . 102c, the second semiconductor subzones 118a, 118b and the first semiconductor subzones 116a . . . 116d may be precisely achieved by adjusting a thickness of the first semiconductor subzones 116a . . . 116d in an electrochemical alkaline wet etching process. A dimension $l_1$ of each of the drift zones 102a . . . 102c along the lateral dimension 110 may be larger than the lateral dimension $l_2$ of each of the second semiconductor subzones 118a, 118b. It is to be noted that FIG. 1A refers to an illustration of a portion of semiconductor compensation device 100. The structure illustrated with regard to FIG. 1 may extend into other portions of semiconductor device 100 and semiconductor device 100 may include a plurality of transistor cells as the ones illustrated in FIG. 1. Semiconductor device 100 may include further elements not illustrated in FIG. 1, either because they are located within a device portion different than the portion illustrated in FIG. 1 or because these elements are not illustrated for reasons of clarity. Examples for these elements not illustrated in FIG. 1 include edge termination structures and measures for increasing avalanche robustness by shaping a dopant profile within the drift zones, by shaping a taper of the first and second zones, or by shaping a dopant concentration profile within the first and second zones.

The first conductivity type may be an N-type and the second conductivity type may be a P-type.

The semiconductor body 104 may include an epitaxial layer on a substrate such as an epitaxial Si layer on a Si substrate. As an example, an $N^+$-type silicon substrate may constitute the drain region 134 and an N-type epitaxial silicon layer formed on the $N^+$-type substrate may constitute the drift zones 102a . . . 102c. An additional epitaxial layer including an average dopant concentration larger than the drift zones 102a . . . 102c and smaller than the substrate may be arranged between the substrate and the drift zones 102a . . . 102c, for example.

The first semiconductor subzones 116a . . . 116d may include epitaxial layers formed on sides of the zones 108a, 108b. The second semiconductor subzone 118a may include an epitaxial layer formed between first semiconductor subzones 116a, 116b. The second semiconductor subzone 118b may include an epitaxial layer formed between first semiconductor subzones 116c, 116d.

The conductive structure 124 may include conductive plugs and conductive layers connected to the conductive plugs. Examples for conductive materials for these elements include metals and doped semiconductors.

Figure 1B:
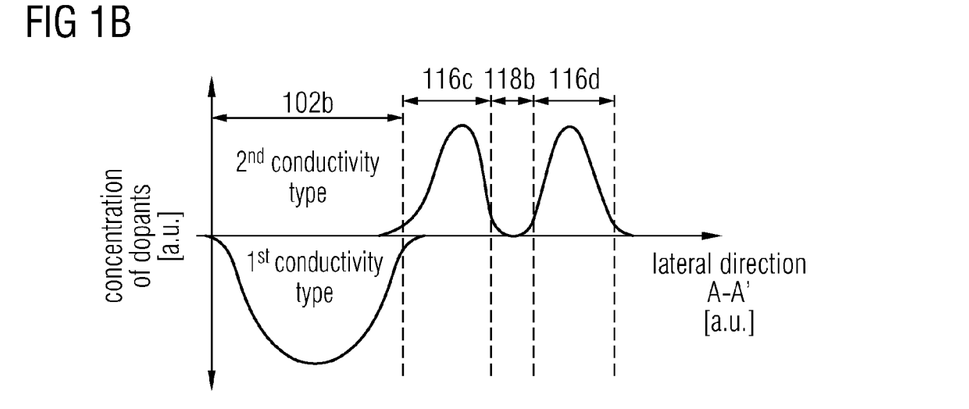
FIG. 1B illustrates one example of a concentration profile of dopants along a line A-A' of the semiconductor compensation device illustrated in FIG. 1A including intrinsic second semiconductor subzones.

FIG. 1B illustrates one example of a concentration profile of dopants along a line A-A' of the semiconductor compensation device illustrated in FIG. 1A. In the lower half of the graph, the dopants are of the first conductivity type and in the upper half of the graph the dopants are of the second conductivity type different from the first conductivity type.

The drift zone 102b includes dopants of the first conductivity type different from the dopants of the second conductivity type formed within the first semiconductor subzones 116c, 116d. A concentration profile of dopants of the second conductivity type includes a maximum within each of the first semiconductor subzones 116c, 116d along the lateral direction A-A'. The concentration of dopants of the second conductivity type at the maximum may be in a range between $10^{15}$ cm$^{-3}$ to $5 \times 10^{16}$ cm$^{-3}$.

A charge carrier concentration within the second semiconductor subzone 118b is intrinsic, i.e., the second semiconductor subzone is undoped, having a value of concentration of dopants smaller than $10^{14}$ cm$^{-3}$ in case of silicon as the material of the second semiconductor subzone 118b.

Figure 1C:
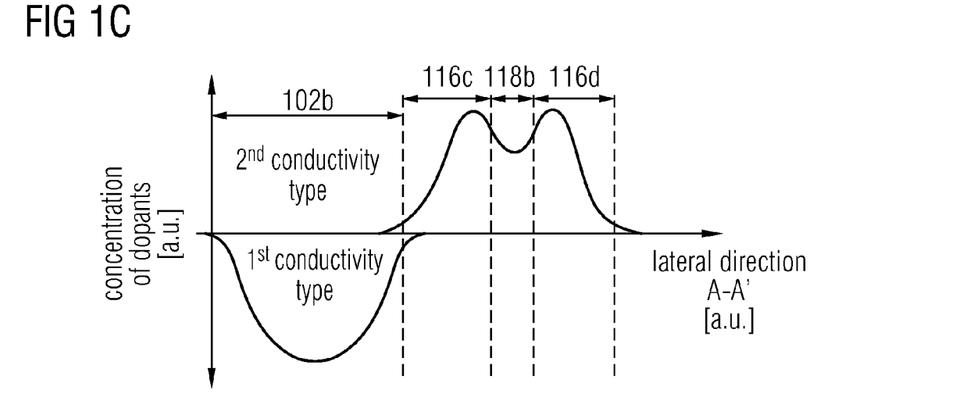
FIG. 1C illustrates one example of a concentration profile of dopants along a line A-A' of the semiconductor compensation device illustrated in FIG. 1A including first and second semiconductor subzones of a same conductivity type.

FIG. 1C illustrates another example of a concentration profile of dopants along the line A-A' of the semiconductor compensation device illustrated in FIG. 1A. In the lower half of the graph, the dopants are of the first conductivity type and in the upper half of the graph the dopants are of the second conductivity type different from the first conductivity type.

The drift zone 102b includes dopants of the first conductivity type different from the dopants of the second conductivity type formed within the first semiconductor subzones 116c, 116d. A concentration profile of dopants of the second conductivity type includes a maximum within each of the first semiconductor subzones 116c, 116d along the lateral direction A-A'. The concentration of dopants of the second conductivity type at the maximum may be in a range between $10^{15}$ cm$^{-3}$ to $5 \times 10^{16}$ cm$^{-3}$.

The second semiconductor subzone 118b is of the second conductivity type and the concentration profile of dopants of the second conductivity type includes at least one minimum within the second semiconductor subzone 118b along the lateral direction A-A'. The dopant species constituting the first and second semiconductor subzones 116c, 116d, 118b may be equal or they may differ from each other.

Figure 1D:
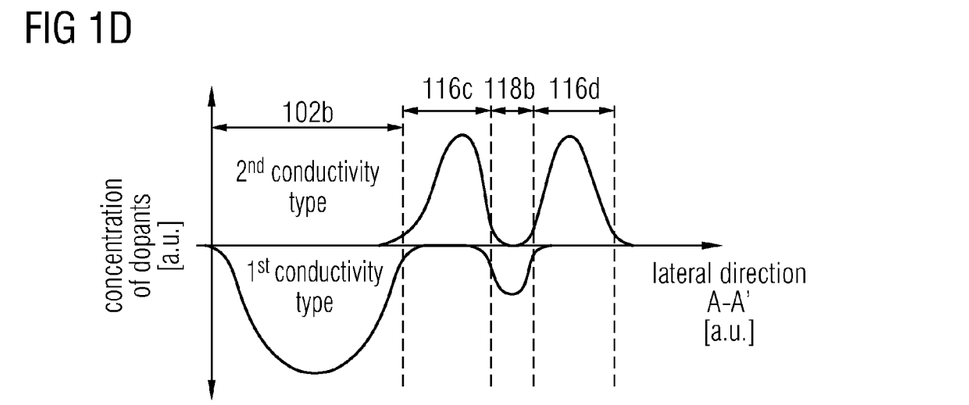
FIG. 1D illustrates one example of a concentration profile of dopants along a line A-A' of the semiconductor compensation device illustrated in FIG. 1A including first and second semiconductor subzones of different conductivity type.

FIG. 1D illustrates another example of a concentration profile of dopants along the line A-A' of the semiconductor compensation device illustrated in FIG. 1A. In the lower half of the graph, the dopants are of the first conductivity type and in the upper half of the graph the dopants are of the second conductivity type different from the first conductivity type.

The drift zone 102b includes dopants of the first conductivity type different from the dopants of the second conductivity type formed within the first semiconductor subzones 116d, 116d. A concentration profile of dopants of the second conductivity type includes a maximum within each of the first semiconductor subzones 116c, 116d along the lateral direction A-A'. The concentration of dopants of the second conductivity type at the maximum may be in a range between $10^{15}$ cm$^{-3}$ to $5 \times 10^{16}$ cm$^{-3}$.

The second semiconductor subzone 118b is of the first conductivity type and a maximum concentration of dopants within the second semiconductor subzone 118b is smaller than the maximum concentration of dopants within the drift zone 102b.

The profiles of dopant concentration illustrated in each of the upper and lower halfs of FIGS. 1B to 1D may be defined by one or several dopant species of the same conductivity type, i.e., the first conductivity type in the lower half and the second conductivity type in the upper half of the graph.

Figure 2A:
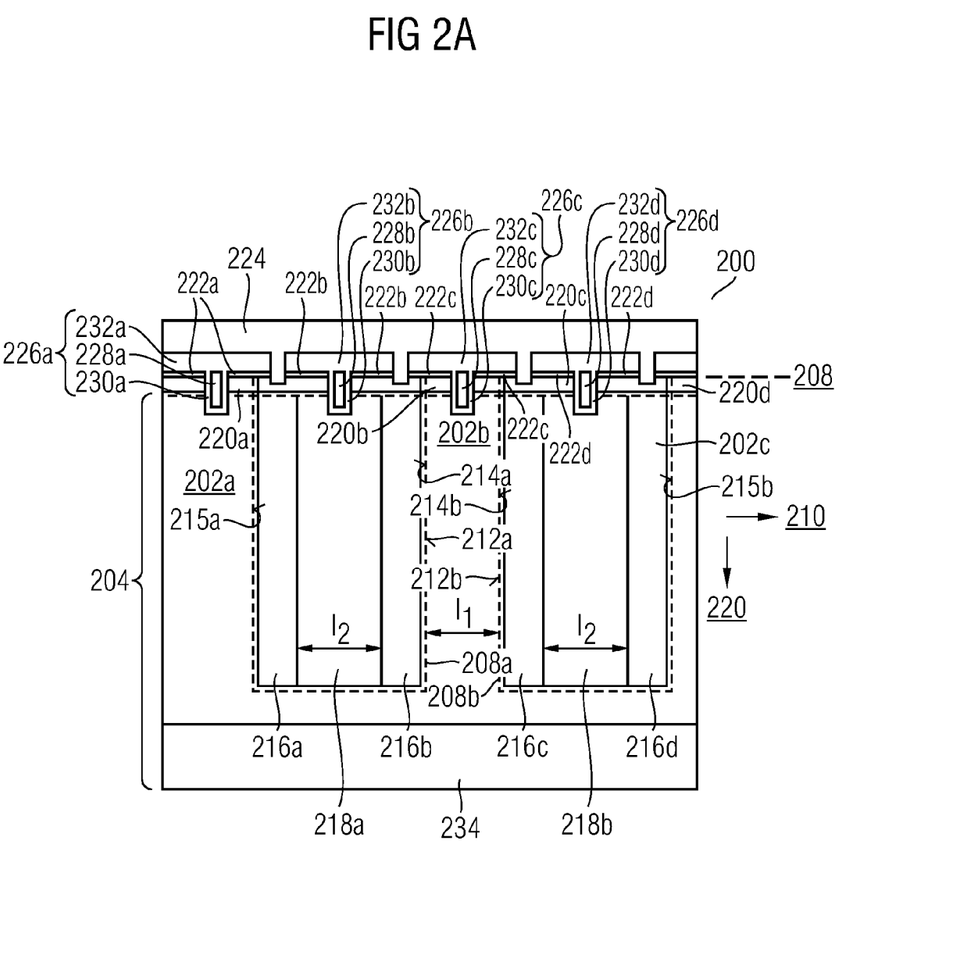
FIG. 2A illustrates a further embodiment of a semiconductor compensation device including a cross-sectional view of a portion of a vertical channel FET including first and second semiconductor subzones of different conductivity type.

FIG. 2A illustrates a cross-sectional view of one embodiment of a vertical channel semiconductor compensation device 200. Similar to semiconductor compensation device 100 illustrated in FIG. 1, semiconductor compensation device 200 includes drift zones 202a . . . 202c, zones 208a, 208b, body regions 220a . . . 220d, source regions 222a . . . 222c, conductive structure 224 and drain region 234.

In contrast to the semiconductor compensation device 100 illustrated in FIG. 1, the second semiconductor subzones 218a, 218b constitute further drift zones of device 200 since gate structures 226a . . . 226d including gate electrodes 228a . . . 228d, gate dielectrics 230a . . . 230d, insulating structures 232a . . . 232d are arranged such that current paths between source and drain extend through both the drift zones 202a . . . 202c and the second conductive subzones 218a, 218b constituting the further drift zones. In one embodiment, one of the gate structures such as gate structure 226b is arranged on a top side and in contact with one of the second semiconductor subzones such as the second semiconductor subzone 218a and one of the gate structures such as gate structure 226a is arranged on a top side and in contact with one of the drift zones such as drift zone 202a. A relation between the average concentration of dopants within the second semiconductor subzones 218a, 218b and the drift zones 202a . . . 202c may be as described with regard to the example illustrated in FIG. 1A. A lateral dimension $l_1$ of each of the drift zones 202a . . . 202c may be equal to the lateral dimension $l_2$ of the second semiconductor subzone. According to other embodiments, $l_1$ may be different from $l_2$, e.g., $l_1 > l_2$.

Figure 2B:
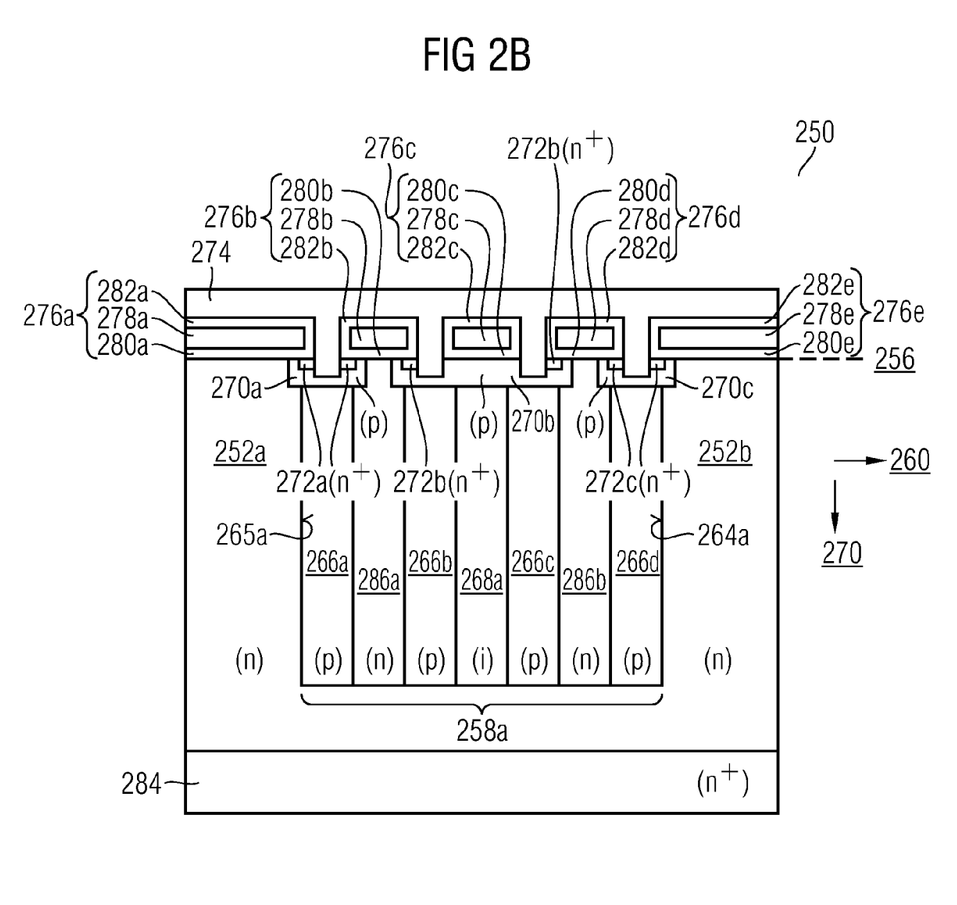
FIG. 2B illustrates another embodiment of a semiconductor compensation device including a cross-sectional view of a portion of a lateral channel FET including first to third semiconductor subzones.

FIG. 2B illustrates a cross-sectional view of one embodiment of a lateral channel semiconductor compensation device 250. Similar to semiconductor compensation device 100 illustrated in FIG. 1, semiconductor compensation device 250 includes drift zones 252a, 252b, zone 258a, body regions 270a . . . 270c, source regions 272a . . . 272c, conductive structure 274, drain region 284, gate structures 276a . . . 276e including gate electrodes 278a . . . 278e, gate dielectrics 280a . . . 280e, insulating structures 282a . . . 282e.

In contrast to the semiconductor compensation device 100 illustrated in FIG. 1, zone 258a furthermore includes third semiconductor subzones 286a, 286b of opposite conductivity type than the first semiconductor subzones 266a . . . 266d. From each side of opposing two sides 264a, 264b within zone 258a, the first and third semiconductor subzones 266a . . . 266d, 286a, 286b are alternately along the lateral direction 260. The second semiconductor subzone 268a is formed between first semiconductor subzones 266b, 266c. The third semiconductor subzones 286a, 286b constitute further drift zones of device 250.

A relation between the average concentration of dopants within the second semiconductor subzone 268a and the drift zones 252a, 252b may be as described with regard to the example illustrated in FIG. 1A.

Figure 3:
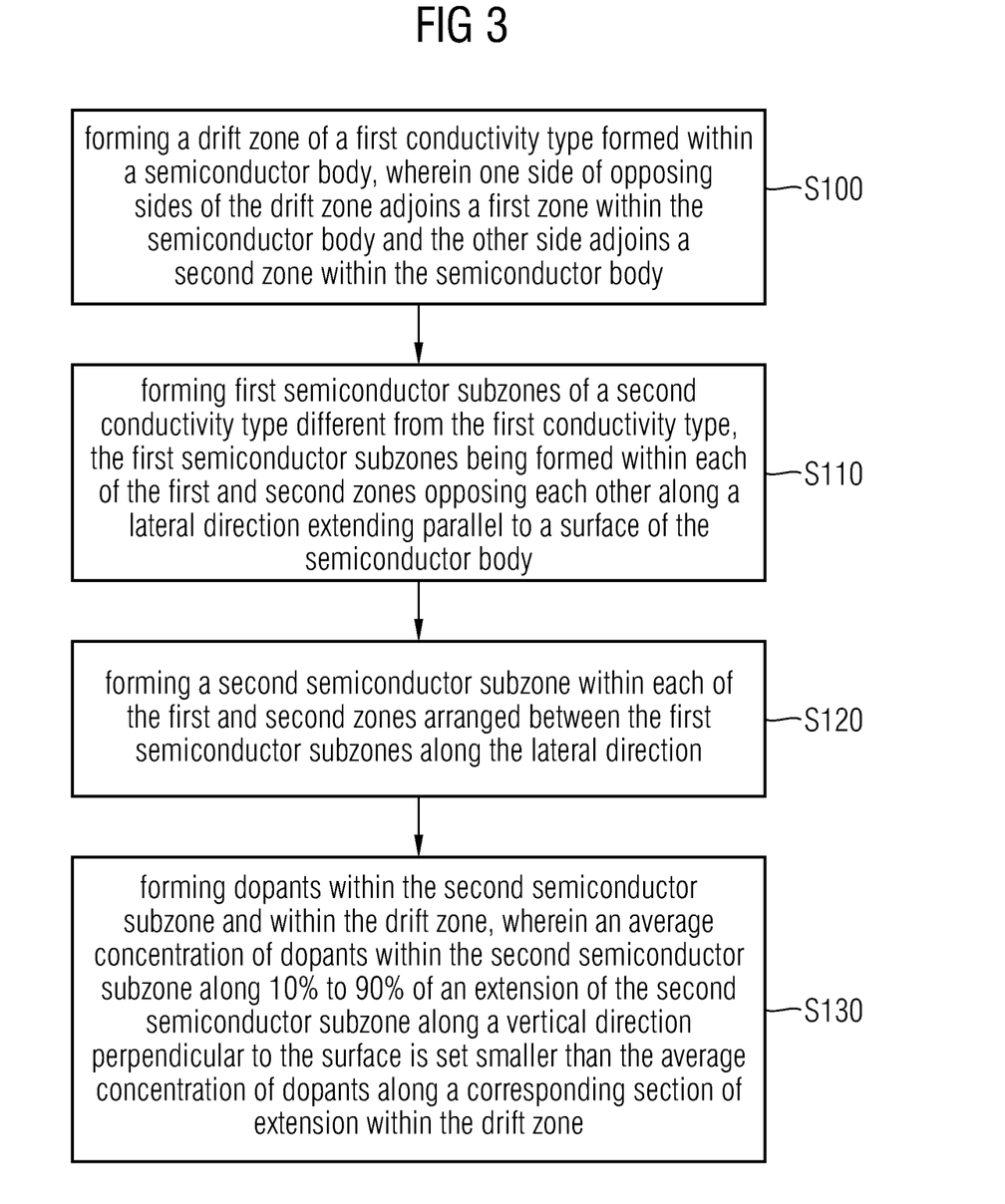
FIG. 3 is a simplified flowchart illustrating a method for manufacturing a semiconductor compensation device according one embodiment.

FIG. 3 is a simplified flowchart of one embodiment of a method for manufacturing a semiconductor compensation device. At S100, a drift zone of a first conductivity type is formed within a semiconductor body, wherein one side of opposing sides of the drift zone adjoins a first zone within the semiconductor body and the other side adjoins a second zone within the semiconductor body.

At S110, first semiconductor subzones of a second conductivity type different from the first conductivity type are formed within each of the first and second zones opposing each other along a lateral direction extending parallel to a surface of the semiconductor body.

At S120, a second semiconductor subzone is formed within each of the first and second zones arranged between the first semiconductor subzones along the lateral direction.

At S130, dopants are formed within the second semiconductor subzone and within the drift zone, wherein an average concentration of dopants within the second semiconductor subzone along 10% to 90% of an extension of the second semiconductor subzone along a vertical direction perpendicular to the surface is set smaller than the average concentration of dopants along a corresponding section of extension within the drift zone.

Method features included in any one of S100 to S130 listed above may be carried out together with, prior of after any other one of S100 to S130. For example, forming dopants within the drift zone at S130 may be carried out together with S100.

Figure 4:
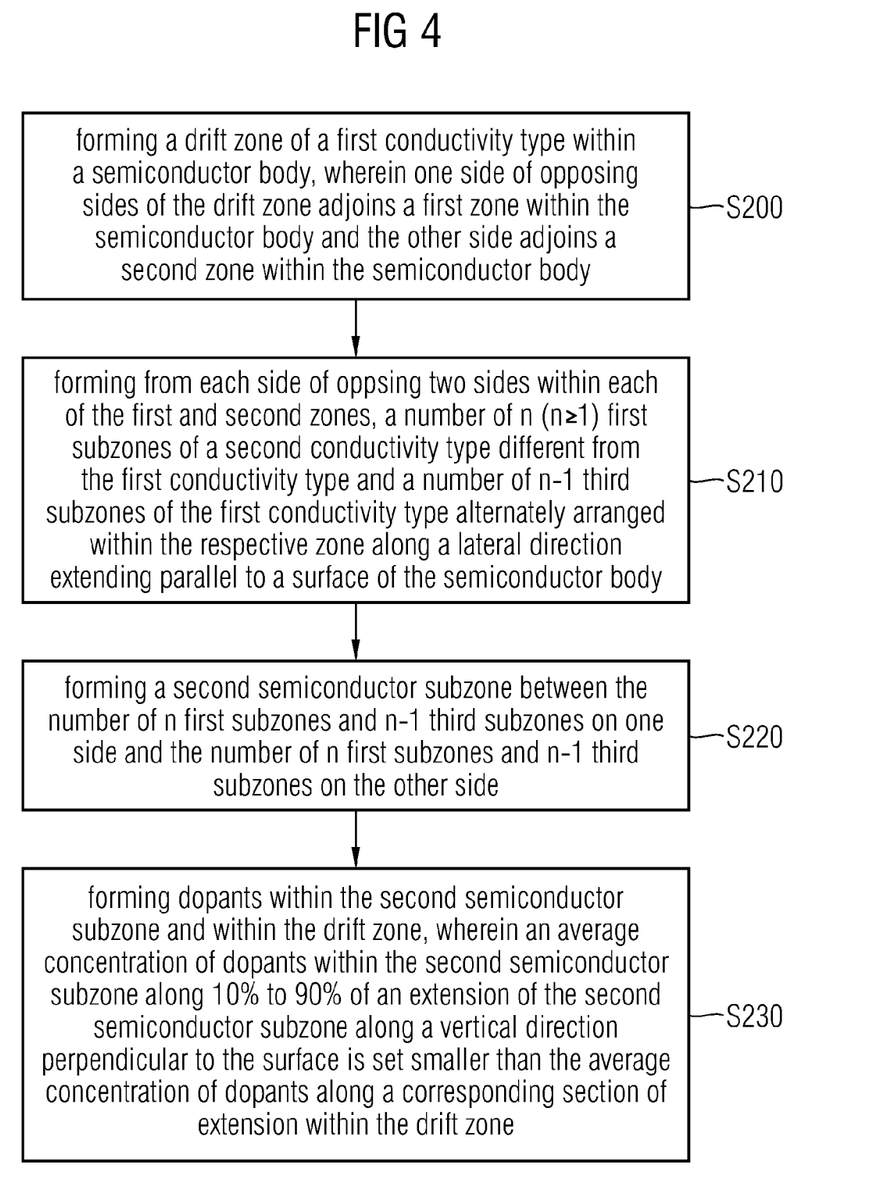
FIG. 4 is a simplified flowchart illustrating a method for manufacturing a semiconductor compensation device according to one embodiment.

FIG. 4 illustrates a simplified flowchart of another embodiment of a method for manufacturing a semiconductor compensation device. Apart from feature S200 corresponding to feature S100 of the method illustrated in FIG. 3, at S210, in the method illustrated in FIG. 4, from each side of opposing two sides within each of the first and second zones, a number of n (n≥1) first subzones of a second conductivity type different from the first conductivity type and a number of n−1 third subzones of the first conductivity type are formed and alternately arranged within the respective zone along a lateral direction extending parallel to a surface of the semiconductor body.

At S220, a second semiconductor subzone is formed between the number of n first subzones and n−1 third subzones on one side and the number of n first subzones and n−1 third subzones on the other side.

At S230, dopants are formed within the second semiconductor subzone and within the drift zone, wherein an average concentration of dopants within the second semiconductor subzone along 10% to 90% of an extension of the second semiconductor subzone along a vertical direction perpendicular to the surface is set smaller than the average concentration of dopants along a corresponding section of extension within the drift zone.

The number n may be equal to, for example, one, two, three or four or even more than four.

Apart from method features illustrated in FIG. 3 or 4, further device elements may be formed together with any one of the illustrated method features, prior to or after any one of these features or between any two of these features. As an example, these methods may also include formation of elements such as a source region, a drain region, a gate structure, a conductive structure electrically coupled to semiconductor elements formed within an active area of the semiconductor body.

According to one embodiment, formation of the first semiconductor subzones includes formation of first and second trenches into the semiconductor body, forming an epitaxial layer on a surface of the semiconductor body, at sidewalls and at a bottom side of the first and second trenches and etching the epitaxial layer by electrochemical alkaline wet etching so as to adjust a thickness of the epitaxial layer. By electrochemical alkaline wet etching the dimension of the first semiconductor subzones may be adjusted so as to achieve precise compensation of the drift zones and the first and second semiconductor subzones. As an electrochemical alkaline solution suited for etching first semiconductor subzones formed of silicon, potassium hydroxide (KOH) or tetramethyl ammonium hydroxide (TMAH) may be used, for example.

When etching the epitaxial layer, a reverse voltage may be applied between the semiconductor body and the epitaxial layer. The reverse voltage may be chosen such that a space charge region extends into an overall volume of the drift zone so that free charge carriers are depleted from this zone. Since the process of etching the first semiconductor subzones by an electrochemical alkaline solution is terminated when full depletion of free charge carriers in the first semiconductor subzones is reached, e.g., a space charge region spreads over an overall volume of the first semiconductor subzones, a thickness of the first semiconductor subzones has to be originally chosen such that a neutral semiconductor volume within the first semiconductor subzones remains also during application of the reverse blocking voltage so that free charge carriers are available for the start of the electrochemical alkaline etch process.

The epitaxial layer may be removed from the surface of the semiconductor body and from a bottom side within each of the first and second trenches by etching so as to leave the epitaxial layer at the sidewalls of the first and second trenches, respectively. This etching may be carried out by anisotropic dry etching, for example.

Gate structures may be arranged in contact with the second semiconductor subzones. Thereby, a further drift zone defined by the second semiconductor subzones may be achieved and this semiconductor volume may contribute to a current path between source and drain.

FIGS. 5A to 5G illustrate schematic cross-sectional views of a semiconductor body portion 404 at different process stages during manufacture of a semiconductor compensation device.

Figure 5A:
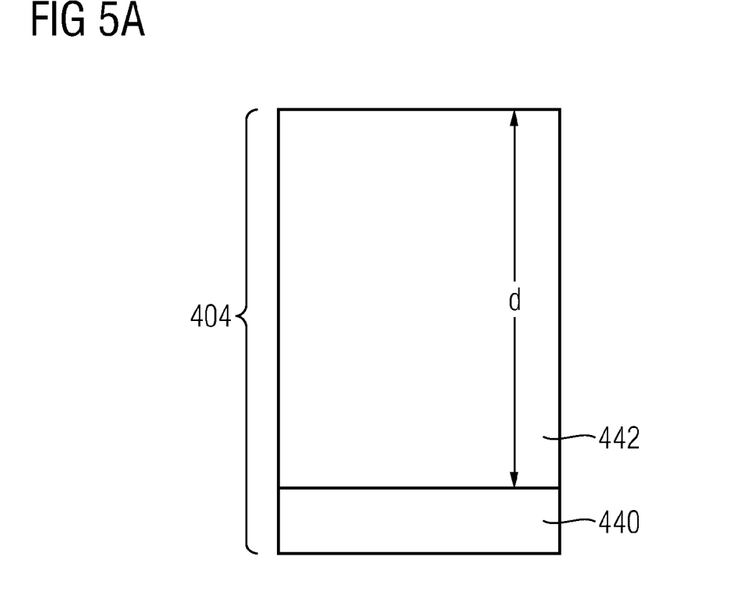
FIG. 5A is a schematic cross-sectional view of a semiconductor body portion for illustrating a method of manufacturing a semiconductor compensation device in accordance with one embodiment.

Referring to FIG. 5A, a semiconductor body 404 including an $N^+$-type substrate 440 and an N-type epitaxial layer 442 formed thereon is provided as a base material.

A thickness d of the epitaxial layer 442 may be chosen in accordance with a target thickness of that volume which absorbs a reverse voltage in an operation mode of the finalized device. A dopant concentration within the epitaxial layer 442 may correspond to the target dopant concentration of N-type columns constituting drift zones of the finalized semiconductor compensation device. The concentration of dopants within the semiconductor layer 442 may be subject to production tolerances. These production tolerances may be due to limited accuracy when setting a dopant concentration during epitaxy, for example.

Figure 5B:
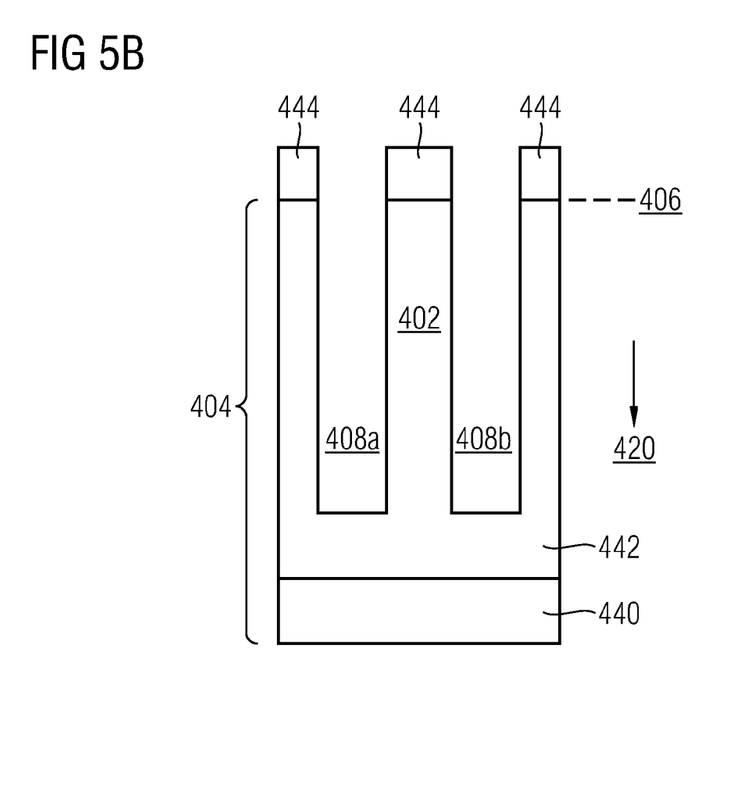
FIG. 5B illustrates one embodiment of a schematic cross-sectional view of the semiconductor body portion of FIG. 5A after formation of first and second trenches.

Referring to the schematic cross-sectional view of FIG. 5B, first and second trenches 408a, 408b are formed within the epitaxial layer 442 extending from a front surface 406 along a vertical direction 420 into a depth of semiconductor body 404. The trenches 408a, 408b may be etched into the semiconductor body 404 using an etch mask such as a hard mask 444 on the surface 406 of the semiconductor body 404. A bottom side of the trenches 408a, 408b may be arranged within the semiconductor layer 442. A mesa region between the trenches 408a, 408b may define drift zones 402.

Figure 5C:
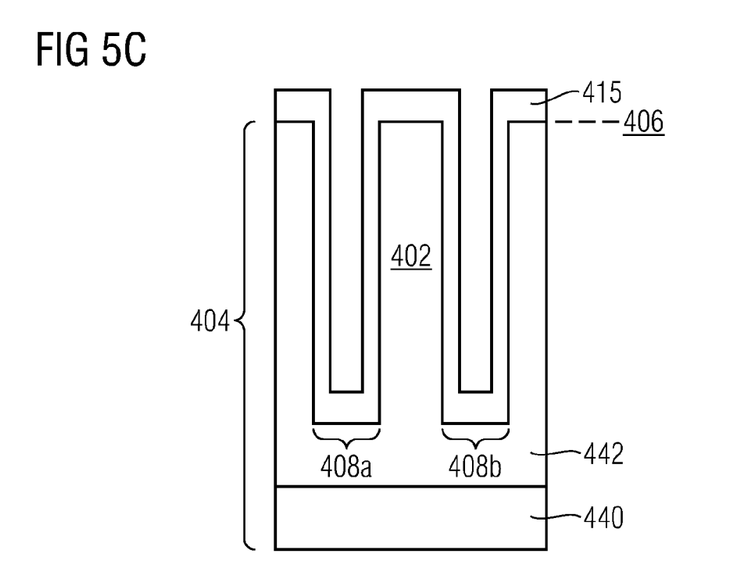
FIG. 5C illustrates one embodiment of a schematic cross-sectional view of the semiconductor body portion of FIG. 5B after formation of an epitaxial semiconductor layer.

Referring to the schematic cross-sectional view of the semiconductor body portion 404 illustrated in FIG. 5C, an epitaxial layer 415 of p-type conductivity is formed on the front surface 406 of the semiconductor body 404 and at sidewalls and a bottom side of each of the first and second trenches 408a, 408b.

Figure 5D:
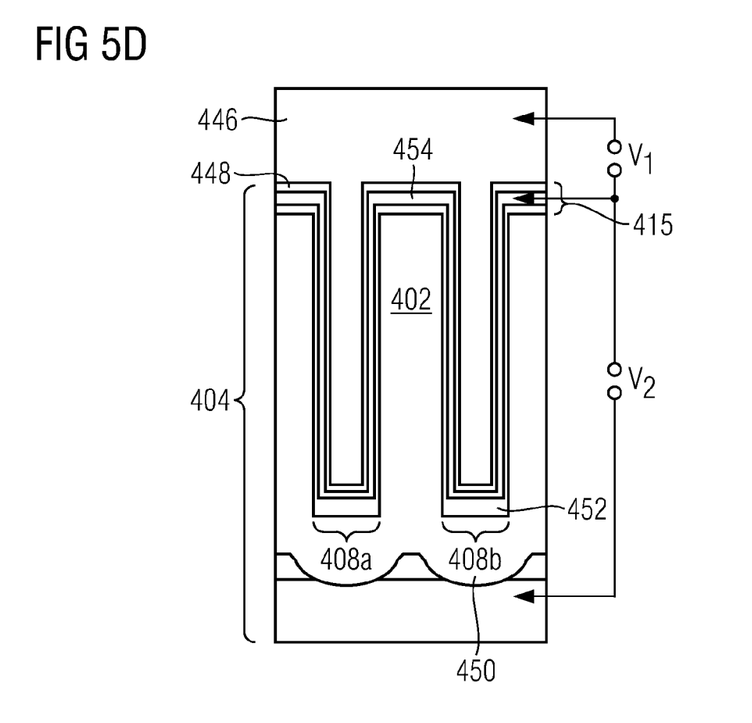
FIG. 5D illustrates one embodiment of a schematic cross-sectional view of the semiconductor body portion of FIG. 5C in a state during electrochemical alkaline wet etching of the epitaxial semiconductor layer.

Referring to the schematic cross-sectional view of the semiconductor body portion 404 illustrated in FIG. 5D, the epitaxial semiconductor layer 415 undergoes electrochemical alkaline wet etching using an electrochemical alkaline solution 446. For example, when etching silicon, the electrochemical alkaline solution may include KOH or TMAH. A voltage $V_1$ is applied between the epitaxial semiconductor layer 415 and the electrochemical alkaline solution 446. A junction between the electrochemical alkaline solution 446 and the epitaxial semiconductor layer 415 is similar to a Schottky barrier junction. Therefore, a Schottky depletion region 448 builds up at this interface. The voltage $V_1$ may be chosen such that the Schottky diode formed by the junction between the epitaxial semiconductor layer 415 and the electrochemical alkaline solution 446 is shorted or forward-biased.

A voltage $V_2$ is applied between the p-type epitaxial semiconductor layer 415 and the n-type semiconductor body 404 such that the pn junction between these regions is reverse-biased and a space charge region including a first depletion layer 450 within the semiconductor body and a second depletion layer 452 within the epitaxial semiconductor layer 415 is formed. A value of $V_2$ may be chosen such that a volume of the semiconductor body 404 between the first and second trenches 408a, 408b, i.e., drift zone 402, becomes depleted of free charge carriers. A thickness of the epitaxial semiconductor layer 415 may be chosen such that the depletion regions 448, 452 do not meet after application of the voltages $V_1$, $V_2$. In other words, the voltages $V_1$ and $V_2$ may be chosen such that a neutral volume 454 not constituting a space charge region remains.

Figure 5E:
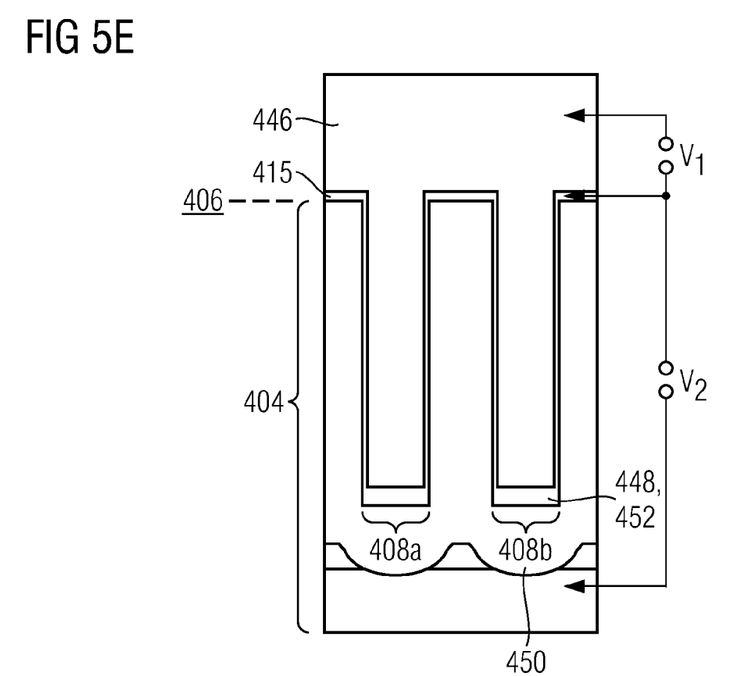
FIG. 5E illustrates one embodiment of a schematic cross-sectional view of the semiconductor body portion of FIG. 5D at the end of electrochemical alkaline wet etching of the epitaxial semiconductor layer.

Referring to the schematic cross-sectional view of the semiconductor body portion 404 illustrated in FIG. 5E, etching of the epitaxial semiconductor layer 415 is terminated once the depletion regions 452 and 448 meet. The volume of the epitaxial semiconductor layer 415 includes two parts, namely the volume of Schottky depletion layer 448 and pn depletion layer 452. Depletion layer 452 causes a precise compensation of the other pn depletion layer 450 formed within the semiconductor body 404. It is to be noted that this charge compensation is not affected by any production tolerances during manufacture of device elements. The charges of Schottky depletion layer 448 constitute excess charges with regard to an ideal charge compensation since the Schottky barrier does not remain after removal of the electrochemical alkaline solution. These excess charges may be counterbalanced or removed in later process stages. As an example, charges of Schottky depletion layer 448 may be removed by isotropic dry or wet etching of a respective portion of epitaxial semiconductor layer 415. As a further example, charges of Schottky depletion layer 448 may also be removed by thermal oxidation of a respective portion of epitaxial semiconductor layer 415 and subsequent removal of the oxide layer by an etch process, for example. As yet another example, charges of Schottky depletion layer 448 may be counterbalanced by filling the trenches 408a, 408b with an epitaxial semiconductor material having a conductivity type different from the conductivity type of the epitaxial semiconductor layer 415. Removal of excess charges by above processes may be carried out after removal of the electrochemical alkaline solution 446 and before filling the trenches 408a, 408b with a semiconductor material as described in a later process stage illustrated in FIG. 5G.

Figure 5F:
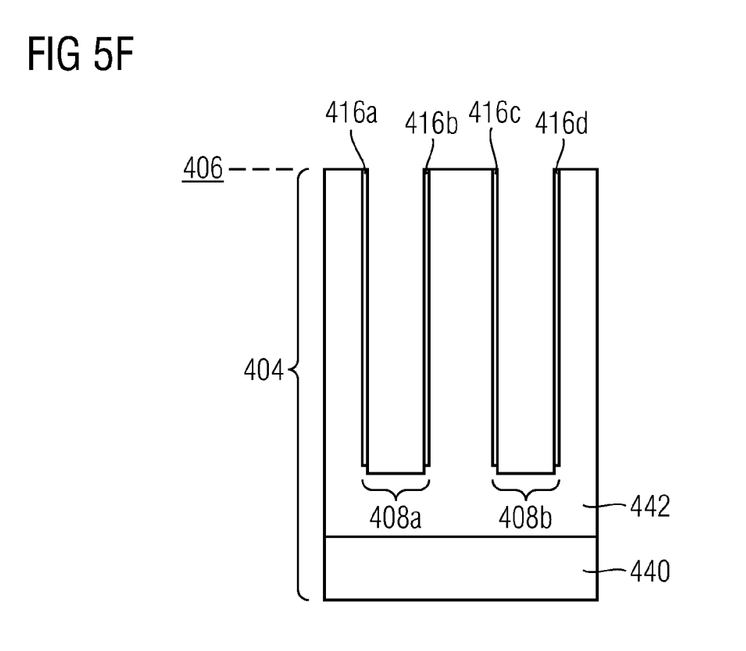
FIG. 5F illustrates one embodiment of a schematic cross-sectional view of the semiconductor body portion of FIG. 5E after electrochemical alkaline wet etching of the semiconductor epitaxial layer and after anisotropic etching of the epitaxial semiconductor layer.

Referring to the schematic cross-sectional view of the semiconductor body portion 404 illustrated in FIG. 5F, the epitaxial semiconductor layer 415 is etched to remove those parts of this layer which are located at a bottom side within each of the trenches 408a, 408b and on the front surface 406 of the semiconductor body 404. As an example, anisotropic dry etching may be used to etch the semiconductor layer 415. After etching, the remaining parts of this layer define first semiconductor subzones 416a . . . 416d within the first and second trenches 408a, 408b.

Figure 5G:
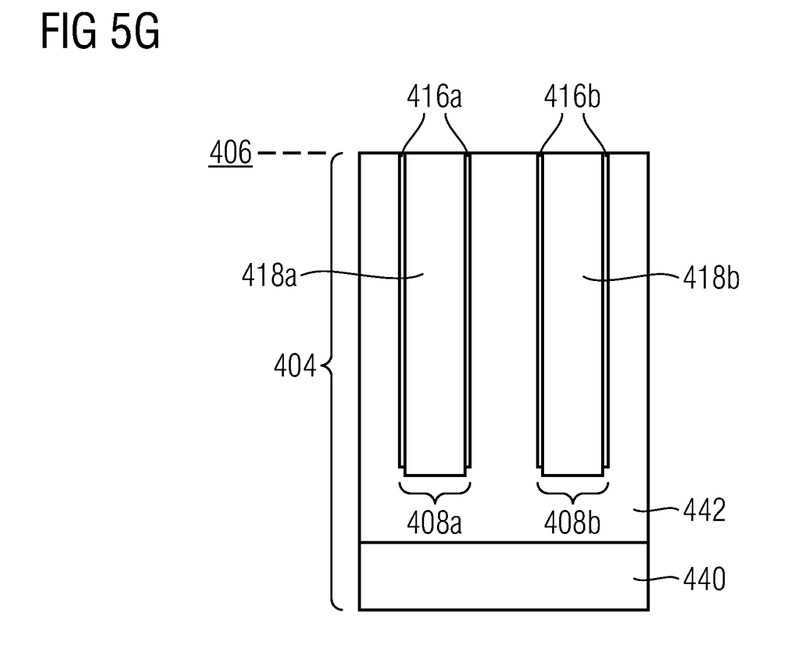
FIG. 5G illustrates one embodiment of a schematic cross-sectional view of the semiconductor body portion of FIG. 5F after filling the first and second trenches with a semiconductor material.

Referring to the schematic cross-sectional view of the semiconductor body portion 404 illustrated in FIG. 5G, the first and second trenches 408a, 408b are filled with a semiconductor material defining a second semiconductor subzone. A concentration of dopants within this second semiconductor structure may be chosen to counterbalance the excess charge carriers of the Schottky depletion layer 448 illustrated in FIGS. 5D, 5E. Thereby, a precise charge compensation with regard to semiconductor layer 442, first semiconductor subzones 416a . . . 416d and second semiconductor subzones 418a, 418b may be achieved. The second semiconductor subzones 418a, 418b may also be formed as intrinsic semiconductor subzones, e.g., in case of preceding removal of the excess charge carriers of the Schottky depletion layer 448 by etching as described above.

Further processes may follow or be carried out before, between or together with the processes illustrated in FIGS. 5A to 5G to complete the semiconductor compensation device.

It is to be understood that the features of the various embodiments described herein may be combined with each other unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptions or variations of the specific embodiments discussed herein. Therefore, it is intended that this invention be limited only by the claims and the equivalents thereof.

What is claimed is:

1. A method for manufacturing a semiconductor device, comprising:
    forming a drift zone of a first conductivity type within a semiconductor body, wherein one side of opposing sides of the drift zone adjoins a first zone within the semiconductor body and the other side adjoins a second zone within the semiconductor body;
    forming from each side of opposing two sides within each of the first and second zones, a number of n (n≥1) first subzones of a second conductivity type different from the first conductivity type and a number of n−1 third subzones of the first conductivity type alternately arranged within the respective zone along a lateral direction extending parallel to a surface of the semiconductor body;
    forming a second semiconductor subzone between the number of n first subzones and n−1 third subzones on one side and the number of n first subzones and n−1 third subzones on the other side;
and further comprising
    forming dopants within the second semiconductor subzone and within the drift zone, wherein an average concentration of dopants within the second semiconductor subzone along 10% to 90% of an extension of the second semiconductor subzone along a vertical direction perpendicular to the surface is set smaller than the average concentration of dopants along a corresponding section of extension within the drift zone.

2. The method of claim 1, wherein
forming the first semiconductor subzones includes
forming first and second trenches into the semiconductor body;
forming an epitaxial layer on a surface of the semiconductor body, at sidewalls and at a bottom side of each of the first and second trenches;
etching the epitaxial layer by electrochemical alkaline wet etching; and
removing the epitaxial layer from the surface of the semiconductor body and from a bottom side within each of the first and second trenches by etching so as to leave the epitaxial layer at the sidewalls of the first and second trenches, respectively.

3. The method of claim 2, wherein
etching the epitaxial layer includes
applying a reverse voltage between the semiconductor body and the epitaxial layer.

* * * * *